United States Patent [19]
Kyriakis

[11] Patent Number: 5,541,509
[45] Date of Patent: Jul. 30, 1996

[54] ELECTRICAL CABLE JACKET AND CONDUCTOR ECCENTRICITY DETECTOR INCLUDING ENERGIZING COIL FORMED ABOUT A TOROID CORE AND MOVABLE PICKUP COIL

[75] Inventor: John Kyriakis, London, England

[73] Assignee: Beta Instrument Co. Ltd., Bucks, England

[21] Appl. No.: 318,479

[22] Filed: Oct. 5, 1994

[30] Foreign Application Priority Data

Oct. 7, 1993 [GB] United Kingdom .................... 9320655

[51] Int. Cl.⁶ .............................. G01R 33/12; G01B 7/30
[52] U.S. Cl. .................................. 324/230; 324/207.17
[58] Field of Search ...................... 324/228, 229, 324/230, 231, 207.15, 239, 207.25, 207.26, 207.22, 207.17; 33/834

[56] References Cited

U.S. PATENT DOCUMENTS

| | | | |
|---|---|---|---|
| 2,779,916 | 1/1957 | Poole | 324/229 |
| 4,086,044 | 4/1978 | Sikora | 425/113 |
| 4,260,566 | 4/1981 | Brouwer et al. | 264/22 |
| 4,349,780 | 9/1982 | Zuber et al. | 324/229 |
| 4,555,665 | 11/1985 | Stanley et al. | 324/229 |
| 4,641,525 | 2/1987 | Merki | 324/230 |
| 4,849,694 | 7/1989 | Coates | 324/230 |
| 5,055,793 | 10/1991 | Mukahey | 324/326 |
| 5,214,376 | 5/1993 | Sikora | 324/207.15 |

FOREIGN PATENT DOCUMENTS

| | | | |
|---|---|---|---|
| 977936 | 6/1981 | U.S.S.R. | 324/229 |
| 0574618 | 1/1946 | United Kingdom . | |
| 0780664 | 8/1957 | United Kingdom | 38/4 |
| 1537899 | 1/1979 | United Kingdom | G01B 7/31 |

*Primary Examiner*—Walter E. Snow
*Assistant Examiner*—Roger Phillips
*Attorney, Agent, or Firm*—Haugen & Nikolai P.A.

[57] ABSTRACT

An apparatus for use in determining the thickness of the insulated coating of an electrical cable manufactured in an extrusion process having means for generating an alternating current in the cable core coupled with means for detecting the magnetic field produced by the current flow in the cable such that in combination with a measurement of the distance from the detection means to the coated cable surface, a determination of coating thickness may be made.

18 Claims, 5 Drawing Sheets

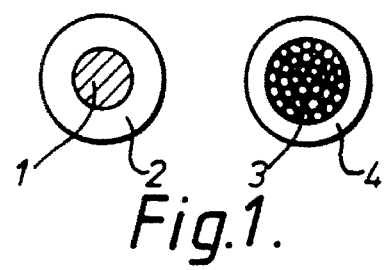
Fig.1.
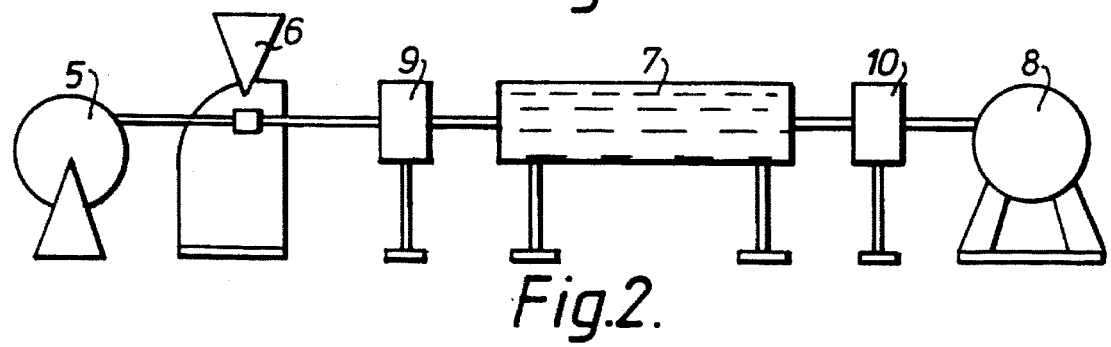
Fig.2.
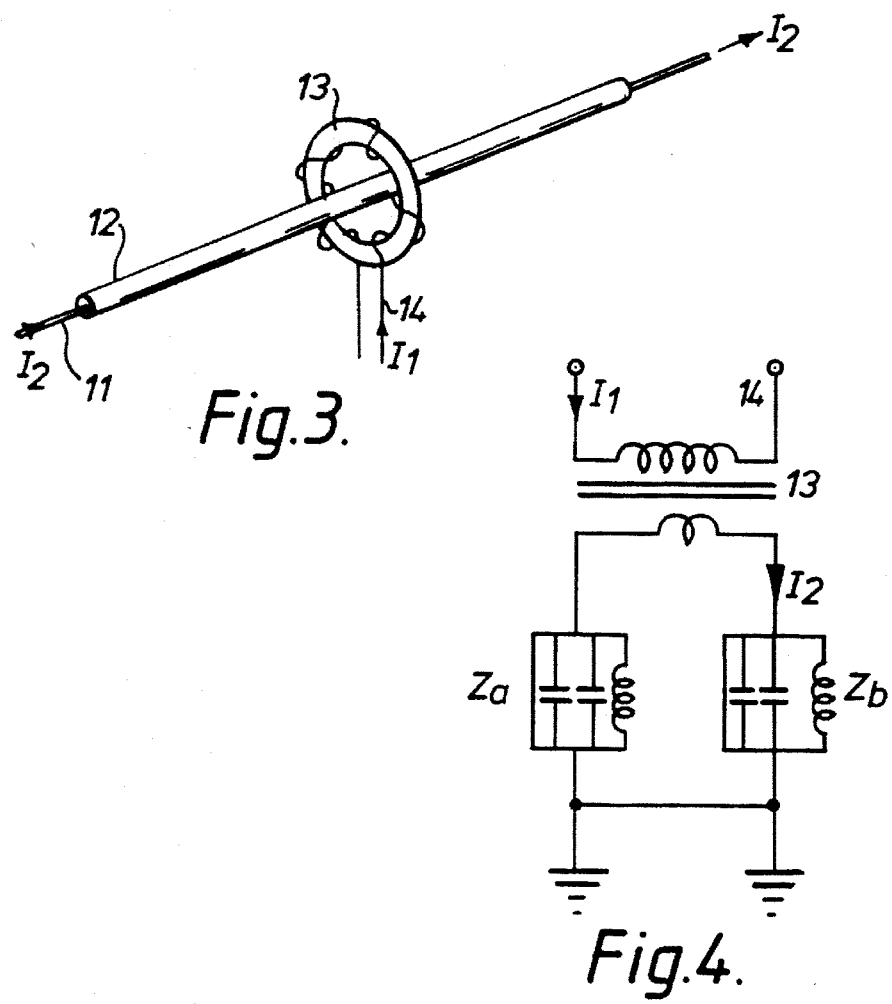
Fig.3.
Fig.4.

ELECTRICAL CABLE JACKET AND CONDUCTOR ECCENTRICITY DETECTOR INCLUDING ENERGIZING COIL FORMED ABOUT A TOROID CORE AND MOVABLE PICKUP COIL

FIELD OF THE INVENTION

The present invention is related to the manufacture of electrical cables which in the main consist of a conducting core and insulation cover around the core, and particularly to meeting the requirement that in order for the final product to be acceptable for its desired application, the insulating jacket which covers the electrical conducting core should be of constant thickness all round the cable product.

BACKGROUND OF THE INVENTION

During the manufacture of electrical cables, a conductor such as a metallic wire or a plurality of wires may be introduced into an extrusion machine on a continuous basis. The extrusion machine is such that it applies a hot insulating jacket around the circumference of the wires, the insulation material being plastic, rubber and the like.

Following the application of the hot plastic insulation sheath around the wire, the resulting cable is introduced into a cooling bath or trough in order to cool the sheath or jacket and the product is then taken up on a reel or drum.

The resulting finished cable is one which is made up of a single or multicore of electrically conducting wires such as copper, aluminium and the like, totally surrounded by a jacket of insulating material.

The purpose of this cable construction is to provide a signal path such as for an electric signal, along the cable core with the jacket acting as an insulating barrier against any short circuiting of the cable to another cable.

It is accepted that for various applications, a variety of thicknesses of jacketing is specified in order to fulfil certain electrical specifications.

For example, if the cable is to be used for high voltage applications the insulating jacket would be of greater thickness than that applied to a cable for low voltage applications.

Therefore, the amount of thickness of the jacket as well as the material of the jacket are contributory factors to the electrical characteristic requirements and breakdown voltage resolutions that are taken into consideration when a particular cable is manufactured.

In addition to the above considerations there is a further very important consideration that must be taken into account when manufacturing a specific type of cable, namely that the thickness of insulation around the circumference of the cable core should be reasonably constant.

The minimum wall thickness will be required to fulfill the electrical considerations mentioned above, but also it is important that although the minimum jacket thickness is applied a commercial consideration arises, so that excessive jacketing material must not be used which would produce an expensive and non-commercially viable product.

Therefore, there is a requirement and need to ensure that the jacket insulation around the cable core is of minimum thickness but also evenly distributed around the cable core. Due to this requirement, means of measuring the jacket insulation around the core are needed to ensure adherence to the above specifications.

SUMMARY OF THE INVENTION

It is accordingly an object of the invention to provide an apparatus for determining the thickness of insulating material extruded onto a conducting core in an electrical cable, such that a constant and optimal thickness of insulating material may be applied to the core both from the viewpoint of safety relating to the breakdown voltage requirements and commercial viability from the minimum amount of material needed consistent with the above.

According to a broader aspect of the invention there is provided apparatus for use in determining the thickness of the insulated coating of an electrical cable manufactured in an extrusion process comprising a toroidal transformer core wound with a primary winding and circumferentially enclosing the cable such that the cable forms the secondary winding of the transformer core as to provide means for generating an alternating current in the core of the cable, feedback means associated with the generator means for maintaining said current in the core constant, detection means for detecting the varying magnetic field around the cable as a result of the passage of said current and providing an output representative of the thickness of the coating in relation to the strength of the field and the distance of the detector means from the surface of the coating, and processing means responsive to said output for determining the thickness of the coating of the cable.

The advantages of the apparatus according to the invention are clear in the light of the above, that is to say the apparatus according to the invention will provide a system allowing the control of the thickness of the insulating jacket over a conducting core which is both reliable and accurate.

Further preferably, the detection means for detecting the varying magnetic field around the cable is comprised by a search coil, the output representative of the distance of the detector means from the core of the cable being provided in the form of an induced voltage appearing across the search coil terminals.

Further preferably the search coil is housed in a structure which is capable of being rotated around the coated electrical cable at right angles to the axis of the cable.

The invention may generally be summarised in a non-limiting way as far as its scope and breadth is concerned as follows:

From one point of view, the invention provides method and apparatus for determining the thickness of the insulating jacket of an elongated product being manufactured on a continuous basis, such as a cable, whereby the conductor is of metallic, electrical conducting material and the jacket is made up of plastic, rubber and the like, in which an induced a.c. current is made to travel in the electrical conductor of the cable by a coupling transformer. This current then generates an alternating magnetic field which is picked up by a search coil. The search coil may be positioned in a structure which makes contact with the surface of the jacket; the search coil outputting a voltage which is proportional to the jacket thickness.

From another point of view the invention provides method and apparatus for determining the jacket thickness, such as a cable in production, in which a current is made to flow in the cable conductor, thus setting up a magnetic field which is picked up by a search coil located in a structure which is in contact with the surface of the jacket. The structure may be made to rotate around the surface of the jacket in order to provide a multiplicity of readings of the thickness of the jacket around the complete circumference of the cable.

The structure carrying the search coil may be such that it comes in contact with the surface of the jacket of the cable via a ceramic, diamond or sapphire surface.

The frequency of the current induced in the wire is, therefore, such that it produces a strong individual field that can be picked up by a search coil some distance away from the cable, thus not actually making contact with the surface of the jacket and the jacket thickness being determined by guiding the cable or at least the cable not changing in lateral position, so that the jacket thickness can be deduced from mathematical equations by taking into account the relative fixed positions in space of the cable and the search coil.

From an additional viewpoint, the invention provides method and apparatus for determining the thickness of the insulating jacket of an elongated product such as a cable whereby the conductor is a metallic electrically conducting material and the outer jacket is made up of an insulating material such as plastic, rubber and the like in which an induced current is made to travel in the electrical conductor of the cable by a coupling transformer. This current then generating an alternating magnetic field which is picked up by a search coil, the search coil being preferably positioned in a structure which makes contact with the surface of the jacket. The search coil outputting a voltage which is proportional to the jacket thickness. A diameter gauge may be positioned in a suitable place to measure the overall diameter of the metallic conductor. A second diameter gauge may be placed suitably to measure the overall diameter of the jacket surrounding the metallic conductor. The outputs of the two diameter gauges are combined with the relative measure of the jacket thickness to provide an absolute measurement of jacket thickness of the product in question.

BRIEF DESCRIPTION OF THE DRAWINGS

Other features and advantages of the invention will become apparent from the following description of a preferred embodiment of the invention with reference to the accompanying drawings wherein;

FIG. 1 shows in cross-sectional view, two types of coated electrical cable manufactured in an extrusion process;

FIG. 2 is a side view of a typical extrusion line for manufacturing the cable types shown in FIG. 1;

FIG. 3 shows a perspective view of a coated electrical cable surrounded by a wound toroidal transformer core as part of the measuring device of the present invention;

FIG. 4 is an equivalent electrical circuit to demonstrate the principle on which the present invention is based;

DETAILED DESCRIPTION OF THE PREFERRED EMBODIMENTS

Figure 5:
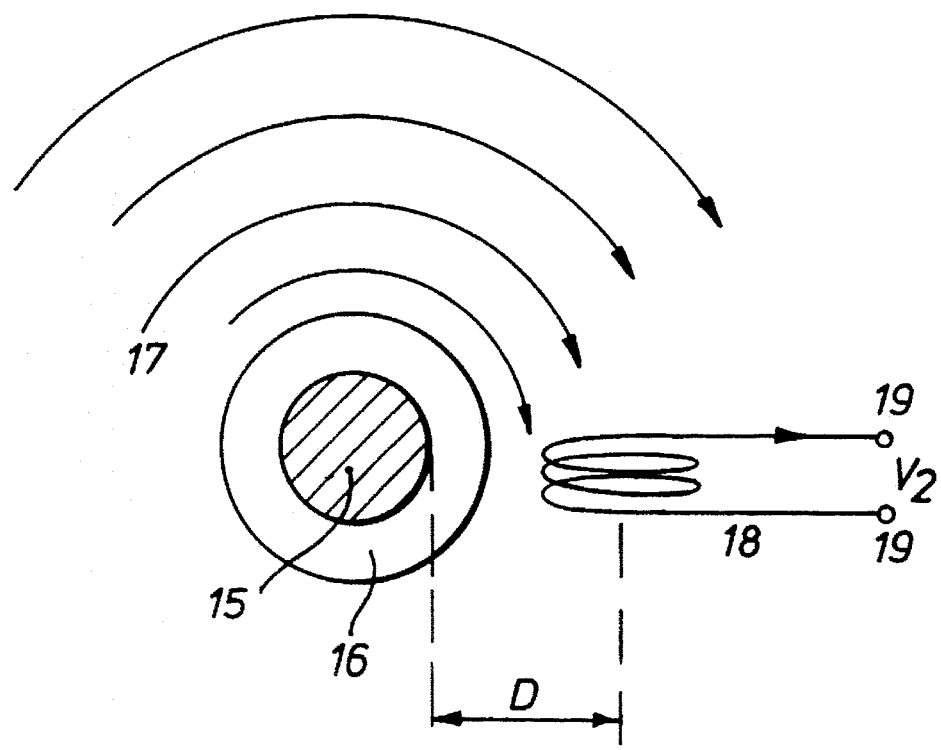
FIG. 5 is a cross-sectional view through an electrical cable being formed in an extrusion line adjacent which is positioned a pick-up coil in accordance with the present invention.

With reference to the drawings, a range of single core cable products presently being manufactured is shown in FIG. 1 and comprises a solid electrical conducting core 1, with a jacket insulation 2 around the core, and a stranded or multiwire core 3 provided with a jacket insulation 4 around a stranded core.

These two products may be manufactured in an extrusion line as shown in FIG. 2. The extrusion line includes a pay-off device 5 for paying off a single or multi-stranded conductor, an extrusion machine 6 for extruding the insulating jacket on the wire, a cooling bath 7 containing circulating water for cooling the insulating jacket material, and a take-up device 8 which takes up and winds the finished cable onto a drum.

A device according to the present invention for determining the thickness of insulating jacket may be installed in the extrusion line shown in FIG. 2 at some point after extrusion has taken place, that is to say either before the cooling trough at position 9 or after the cooling trough 7 at position 10 or indeed it may be possible to split the cooling trough 7 and position the measuring device along the length of the cooling trough 7 in order to determine the thickness of the insulation coating of the cable product.

The way in which the present invention operates is illustrated in FIGS. 3 to 11.

In FIG. 3 a typical cable product is depicted having a conductor 11 and insulating jacket 12.

A toroidal transformer core 13 is positioned around the cable, the core being provided with a winding 14 through which an electric current $l_1$ is passed having a suitable frequency such as to induce a flux through the transformer core 13 which in turn will generate a secondary voltage within the conductor core 11 of the cable 12.

Since the cable 12 travels through water in trough 7 and is wound onto a drum 8 that is essentially earthed, the cable 12 will act as a single turn short circuited secondary winding of the transformer core 13.

FIG. 4 shows an equivalent electrical circuit to demonstrate the above effect including the transformer core 13 and primary winding 14, and wherein primary current $I_1$ flows through the primary winding 14, and the secondary current $I_2$ through the secondary winding, namely the conductor core 11, resulting from the fact that the cable is being short circuited through a distributed capacitance and inductance Za, Zb on either side of the position of the transformer core 13.

The equivalent electrical circuit of FIG. 4 shows the approximate electrical condition occurring in this situation whereby Za and Zb are the distributed capacitance and inductance effects due to the insulating cable being in earthed water in one instance and on an earthed drum in the other.

Therefore, recapping, an alternating current $I_2$ will flow along the cable core 11. This current is of such a value as to reflect the total impedance Za and Zb presented to the circuit by the actual conditions on the line.

Having established that a current $I_2$ is flowing in the conductor 11 of the cable, it becomes possible to detect this current and so determine the jacket thickness of the insulation around the conductor core.

Figure 6:
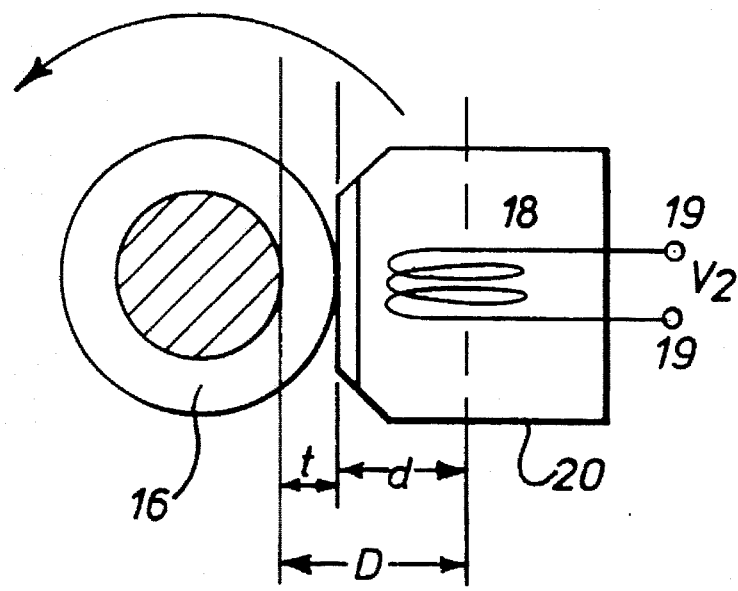
FIG. 6 is a repeat of FIG. 5 but with a defined structure around the pick-up coil forming a cable contact.

With reference to FIGS. 5 and 6 there is shown in cross-section a representative cable having a metallic conductor core 15 provided with an insulating jacket 16. As mentioned previously, a current $I_2$ is induced to flow along the conductor core 15 and this current will generate an alternating magnetic field 17 around itself, as shown by the circular arrows in FIG. 5.

By positioning a pick-up coil 18 in the proximity of the cable, it is possible to pick up part of the field 17 generated by the current $I_2$ and this will give rise to a voltage $V_2$ appearing on the terminals 19 of the pick-up coil 18.

The voltage $V_2$ will be dependent on the field strength 17 as well as the distance D between the surface of the conductor 15 and the coil 18.

The coil 18 may be placed in a structure 20 which makes contact with the surface of the jacket insulation 16, thus establishing a defined distance between the coil itself, namely its axis in the embodiment shown, and the surface of the jacket. Alternatively, if the field is sufficiently strong to be picked up some distance from the cable then the search coil structure may be located at a distance from the cable, so long as the distance between the search coil and the cable outer surface is known, e.g. by guiding the cable in rollers whose position is known relative to the search coil.

The jacket thickness t of the cable product may then be determined from the equation t=D−d, where d is the distance between the coil 18 and the surface of the structure 20 (i.e. the distance between the coil 18 and the surface of the cable when the structure 20 touches the cable).

The values of D and d are taken from a fixed point of the search coil 18 such as its central axis. In order to obtain an accurate value of t, the current $I_2$ in the conductor 15 must be maintained constant.

This can be achieved by feed back means so that even if the conductor 15 or the equivalent earth impedances Za and Zb vary in magnitude, $I_2$ will remain constant.

Hence the only variable that will change will be the jacket thickness t. The voltage $V_2$ appearing at the terminals of coil 18 will be a function of this variable.

In order to measure the jacket thickness of the cable product all the way round, the coil structure 20 may be rotated around the cable product at right angles to the product, at all times remaining in contact with the surface of the jacket insulation 18, therefore providing a series of thicknesses of the jacket continuously around the circumference of the cable product. As stated above in the alternative the measurement may be effected without the structure 20 touching the cable so long as the distance between the search coil and the outer surface of the cable is known.

Figure 7:
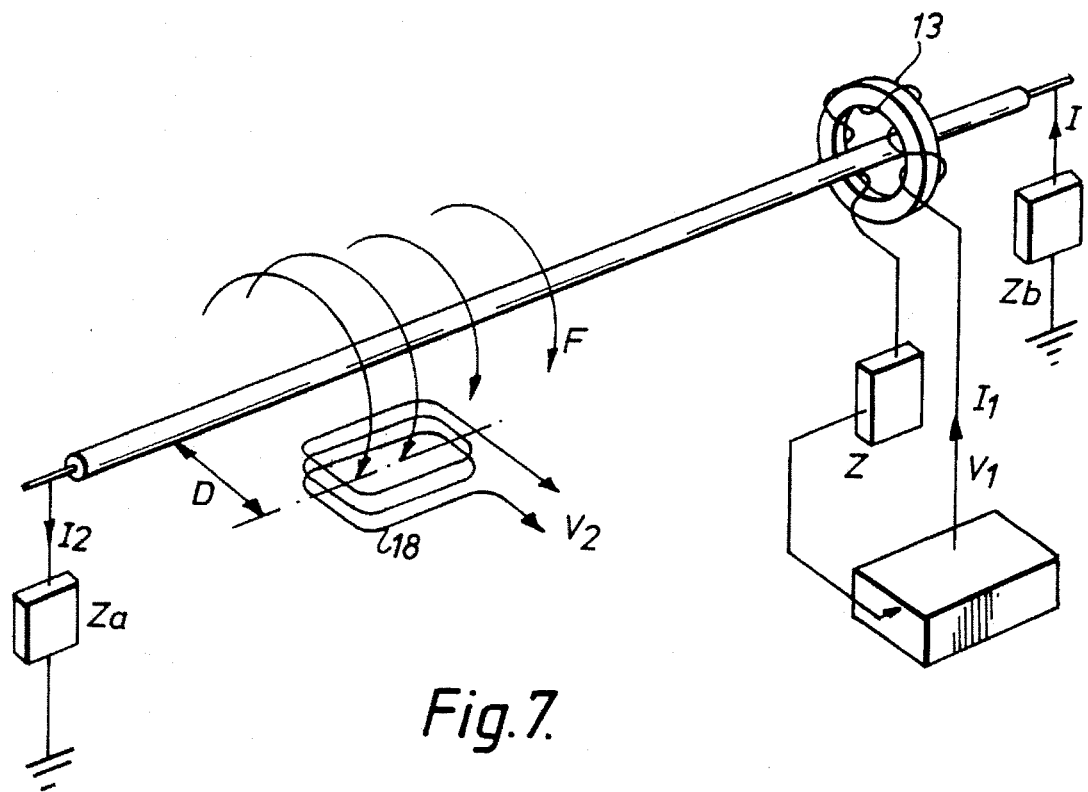
FIG. 7 is a perspective view of the various electrical component parts of the thickness measuring device and their electrical inter-relationships.

A formal theoretical explanation of the principle operation of the system is now given with reference to FIG. 7.

LET:

V1=Primary voltage applied to the toroidal (excitation) transformer.

$I_1$=Primary current for above.

$I_2$=Induced current in cable.

Za, Zb=Distributed impedances of the cable.

F=Induced magnetic field $V_2$=Voltage of search-pick-up coil.

z=Impedance of primary circuit.

D=Distance/Mean of search coil from wire surface.

A=Cross-section of search coil.

N=Number of turns of search coil.

Now $$I_1^2 Z = I_2^2 (Za + Zb)$$

or $$I_2^2 = \frac{I_1^2 Z}{Za + Zb}$$

∴ $$I_2 = I_1 \sqrt{\frac{Z}{Za + Zb}}$$

As Za and Zb are likely to vary due to physical conditions such as wire diameter, jacket thickness and jacket material and the like, the primary current $I_1$ has to be controlled in order to keep the secondary current $I_2$ in the wire constant. This can be achieved by adjustment of Z, the primary impedance of the current.

The field F set up by the flow of current $I_2$ in the wire will be constant at a fixed distance away from the cable core.

Thus $$F \alpha I_2$$

and $$V_2 \alpha \frac{A \cdot N}{D} \frac{dF}{dt}$$

or $$V_2 \alpha \frac{I_2 A N}{D}$$

considering $I_2$ as the magnitude of the ac current ie. the voltage $V_2$ induced in the search coil 18 is proportional to the coils cross section A, the time rate of change of the field strength F and number of coil turns N and inversely proportional to distance D, or $$V_2 = \frac{K I_2 A N}{D}$$

Where K is a constant.

Therefore since $I_2$, A, N are constant we have $$V_2 \alpha \frac{1}{D}$$

Therefore a condition exists in which the output voltage $V_2$ of search coil 20 is inversely proportioned to the distance D between the search coil and the surface of the wire, so that if D is known, t can be determined.

Figure 8:
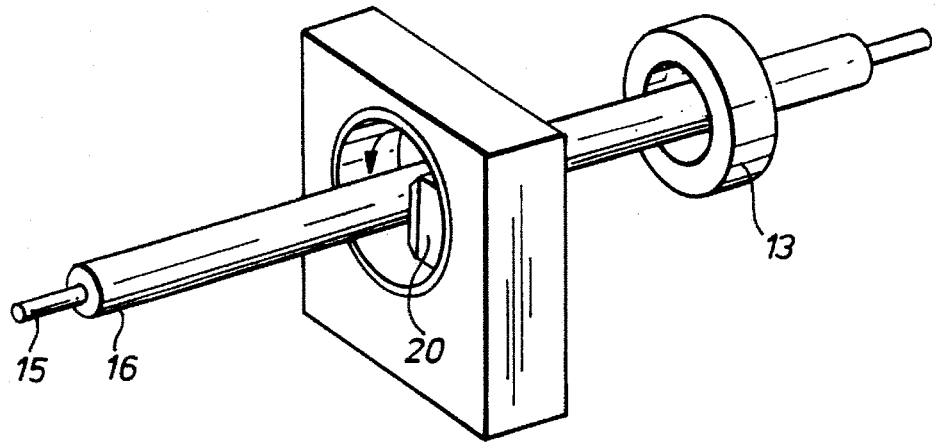
FIG. 8 is a further perspective view of the component parts of the thickness measuring device according to an embodiment of the invention.
Figure 9:
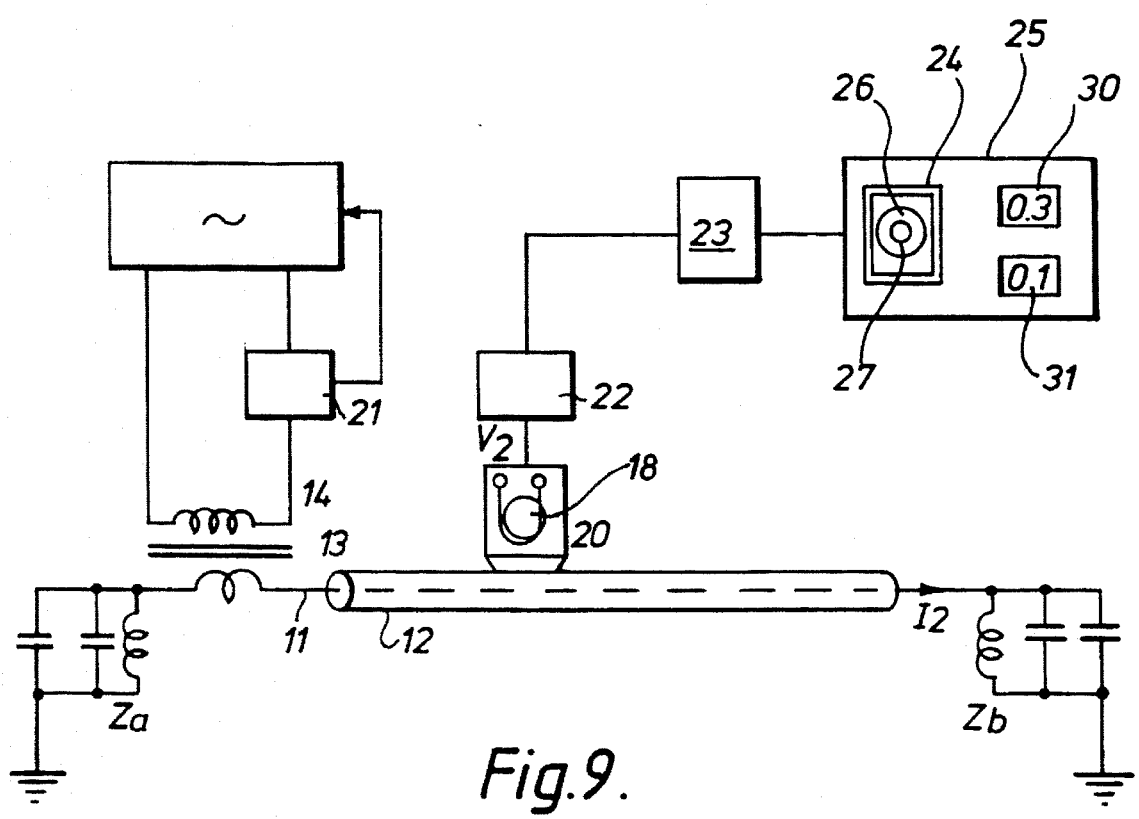
FIG. 9 is a perspective view of a complete measuring system according to an embodiment of the invention.

FIG. 8 shows a perspective view of the principle of construction of the apparatus for determining the jacket thickness of a coated cable while a complete extrusion system is shown in FIG. 9 incorporating a feedback circuit 21 to ensure that current $I_2$ remains constant.

The voltage $V_2$ at the terminals of search coil 18 is fed into a conditioning circuit 22, suitably amplified and demodulated, and then displayed on a CRT 24 on indicator unit 25.

Figure 10:
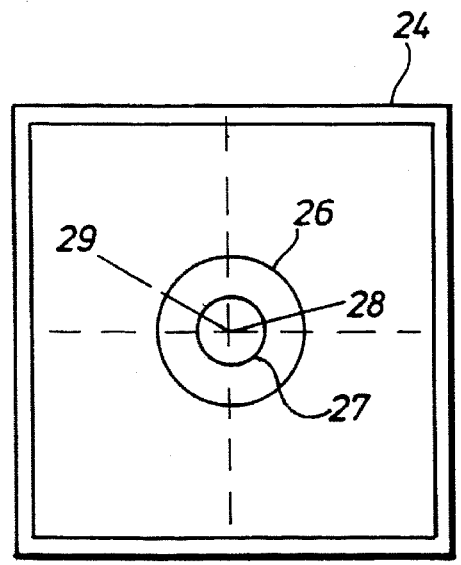
FIG. 10 is an enlarged view of the indicator display of the system shown in FIG. 9.

FIG. 10 illustrates a typical display on CRT 24 in which the two concentric circles represents a section through the cable product, the outer circle 24 being the circumference of the jacket and the inner circle 27 being the circumference of the conductor of the cable.

The axes 28 and 29 are automatically positioned so that axis 28 goes through the point of minimum jacket thickness and axis 29 shows the position of the maximum jacket thickness. Digital displays 30 and 31 provide a readout of the minimum and maximum jacket thickness of the cable.

Figure 11:
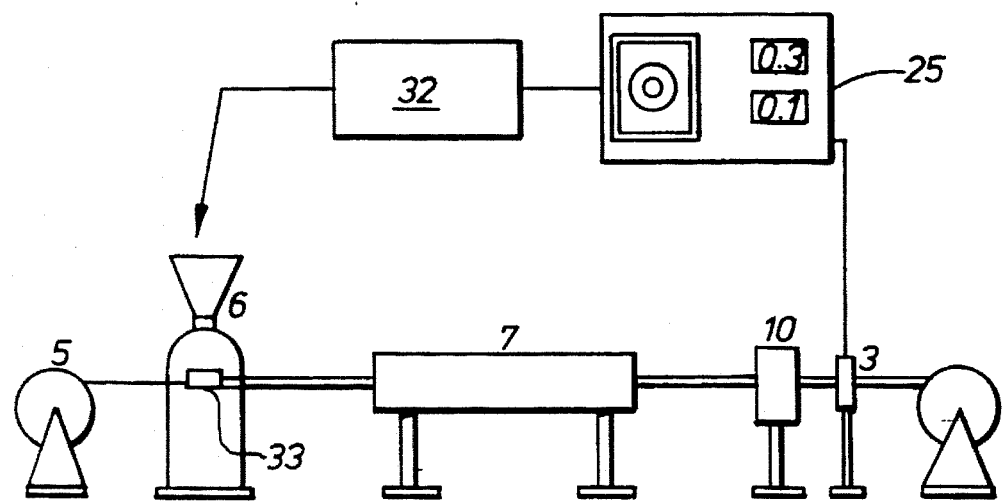
FIG. 11 is a side view of a further embodiment of an extrusion line system incorporating the invention.

Referring to FIG. 11, another feed back controller 32 is shown operating on the p.i.d. (proportional, integral, derivative) principle, which can receive information from the minimum and maximum readouts of the indicator unit 25 and output the signal in order that this signal will correct the position of a die head 33 in the extrusion machine 6 to effect close-loop control and bring about a centralisation of the jacket of the cable.

The method and apparatus described above provides a measure of the jacket thickness of a cable in which in order to determine the actual jacket thickness around the circumference of the cable the system has to be calibrated against a known sample with a known jacket thickness. It is possible, however, to operate a system which would provide an absolute measure of jacket thickness.

Figure 12:
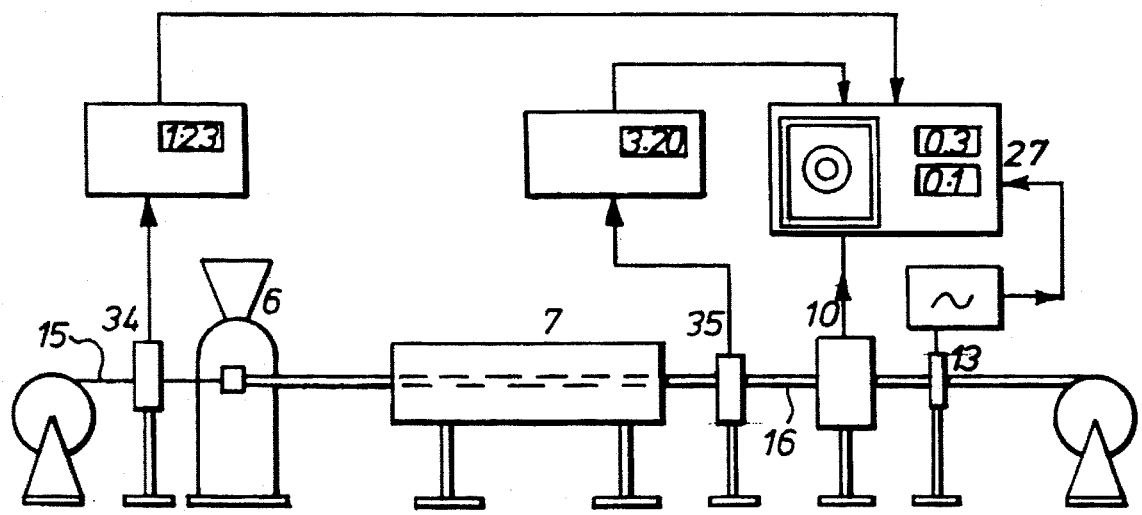
FIG. 12 is a side view of a still further extrusion line system incorporating the invention including a diameter measuring gauge.

Referring to FIG. 12, this represents an extrusion line including a diameter gauging system 34 which measures the diameter of the wire 15 going into the extrusion machine 6. Another diameter gauge 35 is installed in the line which measures the diameter of the coated or jacketed cable 16. The measurements obtained from these two diameter gauges are the diameters of the two circles 26, 27 on the CRT shown in FIG. 10 which may be fed into the jacket thickness indicator 27 to effect an automatic calibration in such a way as to render an accurate measurement of jacket thickness around the cable product 16.

In this way, therefore, a combined system of jacket thickness measurements and diameter measurements of the product will provide an absolute measure of jacket thickness.

What is claimed is as follows:

1. Apparatus for use in determining variations in the thickness of an insulated coating on an electrical cable along the length thereof, said electrical cable including an electrical conductor, said electrical cable being manufactured in an extrusion process wherein said insulated coating is extruded about said electrical conductor as said electrical conductor is drawn through an extrusion machine, comprising:

generating means for generating an alternating current;

a toroidal transformer core wound with a primary winding and circumferentially enclosing said electrical cable such that said electrical cable forms a secondary winding of said toroidal transformer core for inducing an alternating current in said electrical conductor when said primary winding is energized by said generating means;

feedback means associated with said generating means for maintaining said alternating current in said electrical conductor at a constant level;

detection means consisting of a search coil for detecting a varying magnetic field formed around said electrical cable resulting from the passage of said alternating current through said electrical conductor and for providing an output signal representative of the distance between said detection means and said electrical conductor in relation to the strength of said magnetic field, said detection means being located a predetermined and fixed distance from an exterior of said insulated coating; and processing means responsive to said output signal of said detection means for determining the thickness of said insulated coating by subtracting said predetermined and fixed distance between said detection means and said exterior of said insulated coating from said distance between said detection means and said electrical conductor and for generating an output signal representative of said thickness of said insulated coating.

2. Apparatus as claimed in claim 1 characterized in that the detection means for detecting the varying magnetic field around the cable is comprised by a search coil with the output representative of the distance of the detector means from the core of the cable being provided in the form of an induced voltage appearing across the search coil terminals.

3. The apparatus set forth in claim 1 and further, wherein said detection means is housed in a structure which is capable of being rotated around said electrical cable at right angles to a longitudinal axis of said electrical cable, and wherein said processing means is capable of determining a point of minimum thickness of said insulated coating and a point of maximum thickness of said insulated coating.

4. The apparatus set forth in claim 3 and further, wherein said structure has a contacting surface in physical contact with said exterior of said insulated coating.

5. The apparatus set forth in claim 4 and further, wherein said contacting surface of said structure is comprised of one of a ceramic, diamond, and sapphire material.

6. The apparatus set forth in claim 5 and further, wherein said electrical cable is guided by guiding means for maintaining said structure a predetermined and fixed distance away from said exterior of said insulated coating.

7. The apparatus set forth in any preceding claim and further comprising a first and a second diameter measuring gauge means for determining the respective diameters of said conductor and said electrical cable and for outputting said respective diameters to said processing means to calibrate said processing means.

8. The apparatus set forth in any one of claims 1–6 and further, comprising second feedback means responsive to said output of said processing means for controlling the position of a die head of said extrusion machine to ensure a centering of said electrical conductor within said electrical cable.

9. A method for determining variations in the thickness of an insulation jacket on an electrical cable along the length thereof, said electrical cable including an electrical conductor, said electrical cable being manufactured in an extrusion process wherein said insulation jacket is extruded about said electrical conductor cable as said electrical conductor is drawn through an extrusion machine, comprising the steps of:

(a) passing said electrical cable through a central opening of a toroidal core, said toroidal core having a primary winding wound thereon;

(b) applying an alternating electrical current to said primary winding of said toroidal core to induce an alternating electrical current to flow within said electrical conductor;

(c) providing detection means consisting of a search coil disposed a predetermined and fixed distance from an exterior of said electrical cable for sensing a time varying magnetic flux formed around said electrical cable resulting from the passage of said alternating current through said electrical conductor and for providing an output signal representative of the distance between said detection means and said electrical conductor in relation to the strength of said magnetic flux; and (d) providing processing means in communication with said detection means for calculating the thickness of said insulation jacket from said output signal of said detection means and for producing a further output signal representative of said thickness of said insulation jacket.

10. The method as set forth in claim 9 and further, wherein step (b) comprises the sub-steps of: (i) providing first feedback means in electrical communication with said primary winding for adjusting said alternating electrical current flowing through said primary winding, and (ii) adjusting said first feedback means to maintain said alternating electrical current within said electrical conductor at a constant level, and wherein step (d) comprises the sub-step of subtracting said predetermined and fixed distance between said detection means and said exterior of said insulated coating from said distance between said detection means and said electrical conductor.

11. The method as set forth in claim 10 and further, wherein step (c) comprises the sub-step of disposing said detection means in a structure which is capable of being rotated around said electrical cable in a circular orbit at right angles to the axis of said electrical cable.

12. The method as set forth in claim 11 and further, wherein step (c) comprises the further sub-step of positioning said structure in physical contact with said electrical cable.

13. The method as set forth in claim 12 and further, wherein step (c) comprises the further sub-step of providing said structure with a wear-resistant surface for effectuating said physical contact, said wear-resistant surface comprising one of a ceramic, diamond, and sapphire material.

14. The method as set forth in claim 11 and further, wherein step (c) comprises the further sub-steps of:
   (i) providing guiding means for maintaining said structure a predetermined and fixed distance from said exterior of said insulation jacket; and
   (ii) disposing said electrical cable within said guiding means to maintain said predetermined and fixed distance between said structure and said exterior of said insulation jacket.

15. The method as set forth in claim 13, comprising the further steps of:
   (e) providing a first diameter measuring gauge means for determining the diameter of said electrical conductor and a second diameter measuring gauge means for determining the diameter of said electrical cable; and
   (f) calibrating said processing means with said diameter of said electrical conductor and said diameter of said electrical cable as determined by said first and second diameter measuring gauge means to provide the absolute thickness of said insulation jacket of said electrical cable.

16. The method as set forth in claim 15 and further, comprising the steps of:
   (g) providing second feedback means for controlling said extrusion process, said second feedback means being responsive to said output signal of said processing means; and
   (h) controlling said extrusion process to ensure a centering of said electrical conductor within said insulation jacket.

17. The method as set forth in claim 14, comprising the further steps of:
   (e) providing a first diameter measuring gauge means for determining the diameter of said electrical conductor and a second diameter measuring gauge means for determining the diameter of said electrical cable; and
   (f) calibrating said processing means with said diameter of said electrical conductor and said diameter of said electrical cable as determined by said first and second diameter measuring gauge means to provide the absolute thickness of said insulation jacket of said electrical cable.

18. The method as set forth in claim 17 and further, comprising the steps of:
   (g) providing second feedback means for controlling said extrusion process, said second feedback means being responsive to said output signal of said processing means; and
   (h) controlling said extrusion process to ensure a centering of said electrical conductor within said insulation jacket.

* * * * *